United States Patent
Miyaji

(10) Patent No.: US 7,606,639 B2
(45) Date of Patent: Oct. 20, 2009

(54) LOCAL POWER CONSUMPTION LOAD CONTROL

(75) Inventor: Wendell M. Miyaji, Chester, NJ (US)

(73) Assignee: Comverge, Inc., Norcross, GA (US)

( * ) Notice: Subject to any disclaimer, the term of this patent is extended or adjusted under 35 U.S.C. 154(b) by 268 days.

(21) Appl. No.: 11/470,534

(22) Filed: Sep. 6, 2006

(65) Prior Publication Data

US 2007/0129850 A1 Jun. 7, 2007

Related U.S. Application Data

(60) Provisional application No. 60/714,801, filed on Sep. 7, 2005.

(51) Int. Cl.
G05F 1/66 (2006.01)
(52) U.S. Cl. .................. 700/296; 700/295; 307/39
(58) Field of Classification Search ........ 700/295, 700/296; 307/39, 31; 315/291; 713/300, 713/320
See application file for complete search history.

(56) References Cited

U.S. PATENT DOCUMENTS

| | | |
|---|---|---|
| 4,298,935 A | 11/1981 | Lange et al. |
| 4,337,401 A | 6/1982 | Olson |
| 4,347,974 A | 9/1982 | Pinckaers et al. |
| 4,387,763 A | 6/1983 | Benton |
| 4,389,577 A | 6/1983 | Anderson et al. |
| 4,413,250 A | 11/1983 | Porter et al. |
| 4,435,162 A | 3/1984 | Schoenwald |
| 4,616,325 A | 10/1986 | Heckenbach et al. |
| 4,633,217 A | 12/1986 | Akano |
| 4,742,475 A | 5/1988 | Kaiser et al. |
| 4,753,388 A | 6/1988 | Rummage |
| 4,776,514 A | 10/1988 | Johnstone et al. |
| 4,819,180 A | 4/1989 | Hedman et al. |
| 4,889,179 A | 12/1989 | Merenda |
| 5,133,302 A | 7/1992 | Yamada et al. |
| 5,289,362 A | 2/1994 | Liebl et al. |
| 5,598,349 A | 1/1997 | Elliason et al. |
| 5,635,896 A | 6/1997 | Tinsley et al. |
| 5,644,173 A | 7/1997 | Elliason et al. |
| 5,675,503 A | 10/1997 | Moe et al. |
| 5,761,083 A | 6/1998 | Brown, Jr. et al. |

(Continued)

FOREIGN PATENT DOCUMENTS

JP 9-266630 * 10/1997

(Continued)

Primary Examiner—Albert DeCady
Assistant Examiner—Steven R Garland
(74) Attorney, Agent, or Firm—Philip H. Burrus, IV

(57) ABSTRACT

A method and system for curtailing energy consumption of an appliance, such as an air conditioning compressor or heat pump, is provided. A control unit stores information relating to the load, which may include a connected load value, such as a power consumption value or efficiency rating. The control unit then monitors the appliance to determine when the appliance is calling for energy. Upon receiving an energy reduction value from a remote source, the control unit then calculates a permitted run time from the energy reduction value and the connected load value. The control unit, through a switch, then permits the appliance to be operable only for the permitted run time so as to reduce power consumption by a predetermined amount.

19 Claims, 2 Drawing Sheets

U.S. PATENT DOCUMENTS

| | | |
|---|---|---|
| 5,816,491 A | 10/1998 | Berkeley et al. |
| 5,926,776 A | 7/1999 | Glorioso et al. |
| 6,108,614 A | 8/2000 | Lincoln et al. |
| 6,212,894 B1 | 4/2001 | Brown et al. |
| 6,254,009 B1 | 7/2001 | Proffitt et al. |
| 6,305,611 B1 | 10/2001 | Proffitt et al. |
| 6,307,464 B1 | 10/2001 | Miller et al. |
| 6,320,494 B1 | 11/2001 | Bartles et al. |
| 6,385,510 B1 | 5/2002 | Hoog et al. |
| 6,449,533 B1 | 9/2002 | Mueller et al. |
| 6,478,084 B1 | 11/2002 | Kumar et al. |
| 6,480,803 B1 | 11/2002 | Pierret et al. |
| 6,574,581 B1 | 6/2003 | Bohrer et al. |
| 6,619,555 B2 | 9/2003 | Rosen |
| 6,622,097 B2 | 9/2003 | Hunter |
| 6,622,926 B1 | 9/2003 | Sartain et al. |
| 6,634,566 B2 | 10/2003 | Archacki, Jr. et al. |
| 6,643,566 B1 | 11/2003 | Lehr et al. |
| 6,643,567 B2 | 11/2003 | Kold et al. |
| 6,718,213 B1 | 4/2004 | Enberg |
| 6,798,341 B1 | 9/2004 | Eckel et al. |
| 6,822,555 B2 | 11/2004 | Mansfield, Jr. et al. |
| 6,956,463 B2 | 10/2005 | Crenella et al. |
| 7,062,361 B1 | 6/2006 | Lane |
| 7,130,719 B2 | 10/2006 | Ehlers et al. |
| 2003/0187549 A1 | 10/2003 | Bohrer et al. |
| 2005/0188706 A1 | 9/2005 | Tokushige et al. |
| 2006/0036350 A1 | 2/2006 | Bohrer et al. |

FOREIGN PATENT DOCUMENTS

| | | |
|---|---|---|
| JP | 2003/262387 | 9/2003 |
| JP | 2003262387 A | 9/2003 |

\* cited by examiner

LOCAL POWER CONSUMPTION LOAD CONTROL

CROSS REFERENCE TO PRIOR APPLICATIONS

This application claims priority and benefit under 35 U.S.C. §119(e) from U.S. Provisional Application No. 60/714,801, filed Sep. 7, 2005, which is incorporated by reference for all purposes.

BACKGROUND

1. Technical Field

This invention relates generally to load control systems, and more specifically to a method and apparatus for reducing running time of a load, such as an air compressor or furnace, to achieve a power consumption reduction.

2. Background Art

As the cost of energy continues to rise, heating and cooling a home has become a complicated activity. When natural gas, heating oil and electric power were plentiful and inexpensive, one may simply have set the thermostat on 78 in the summer and 68 in the winter to adequately heat and cool a house. Under such a plan, they may only touch the thermostat twice in a year.

The process of supplying energy has become more complex as well. With deregulation of various utilities, suppliers of energy have less input regarding the interaction of the various components of the overall system. For example, while once a single company controlled generation, transmission, and distribution, today each function may be controlled by a different entity.

While divesture and competition helps the consumer regarding price, without proper coordination between the various entities, problems can arise. For example, on a hot summer day, consumers may demand unusually large amounts of energy to cool their homes. While generators may be able to deliver this energy, if the transmission system is not configured to handle such large quantities of energy, failures, including blackouts, can occur.

There is thus a need for a system and method for a control device to be able to monitor a load so as to provide load control based upon energy consumption criteria. It would be advantageous if such a method and system would provide a number of kilowatts, for example, of demand relief rather than a certain number of minutes of appliance control or a certain number of minutes relative to previous appliance run time.

BRIEF DESCRIPTION OF THE DRAWINGS

The accompanying figures, where like reference numerals refer to identical or functionally similar elements throughout the separate views and which together with the detailed description below are incorporated in and form part of the specification, serve to further illustrate various embodiments and to explain various principles and advantages all in accordance with the present invention.

Figure 1:
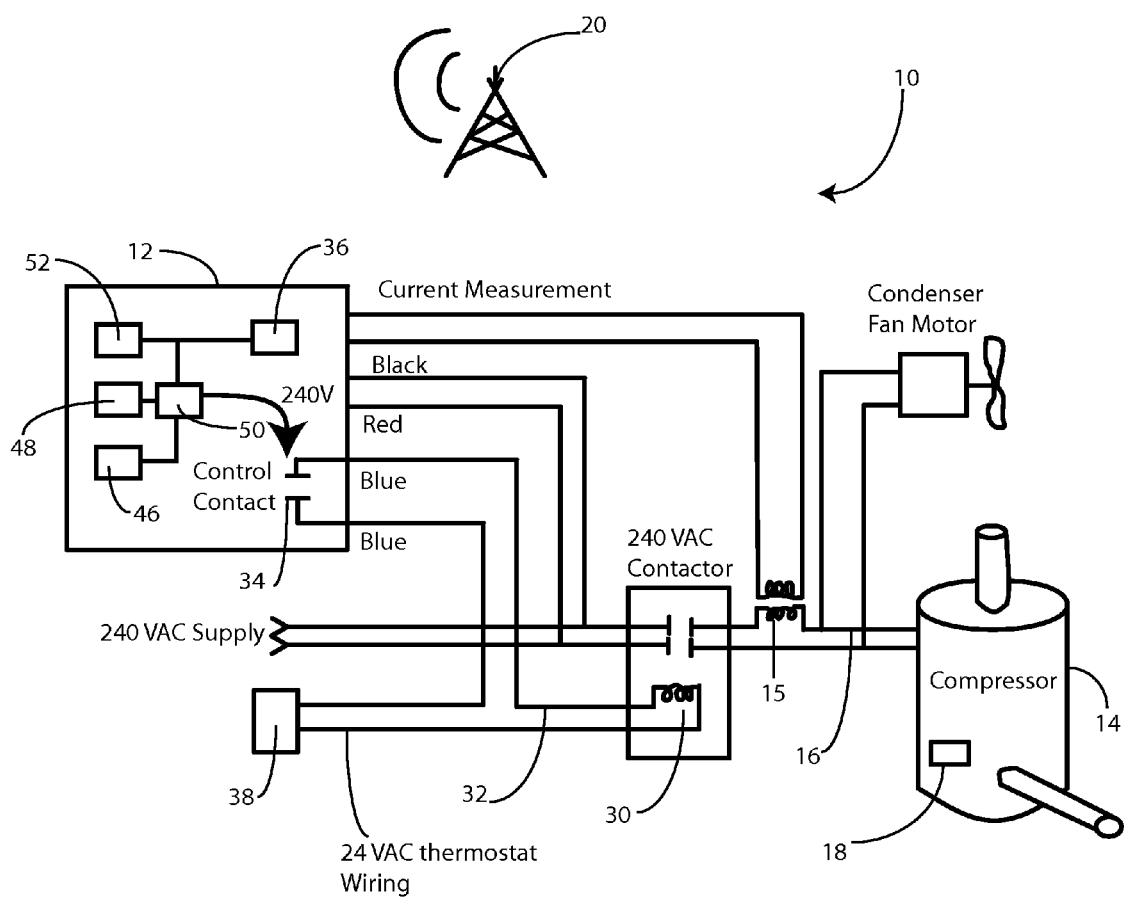
FIG. 1 illustrates a system in accordance with one embodiment of the invention.

Skilled artisans will appreciate that elements in the figures are illustrated for simplicity and clarity and have not necessarily been drawn to scale. For example, the dimensions of some of the elements in the figures may be exaggerated relative to other elements to help to improve understanding of embodiments of the present invention.

DETAILED DESCRIPTION OF THE INVENTION

Before describing in detail embodiments that are in accordance with the present invention, it should be observed that the embodiments reside primarily in combinations of method steps and apparatus components related to limiting energy demand by a number of kilowatts. Accordingly, the apparatus components and method steps have been represented where appropriate by conventional symbols in the drawings, showing only those specific details that are pertinent to understanding the embodiments of the present invention so as not to obscure the disclosure with details that will be readily apparent to those of ordinary skill in the art having the benefit of the description herein.

It will be appreciated that embodiments of the invention described herein may be comprised of one or more conventional processors and unique stored program instructions that control the one or more processors to implement, in conjunction with certain non-processor circuits, some, most, or all of the functions of the system and method described herein. The non-processor circuits may include, but are not limited to, a radio receiver, a radio transmitter, signal drivers, clock circuits, power source circuits, and user input devices. Further, it is expected that one of ordinary skill, notwithstanding possibly significant effort and many design choices motivated by, for example, available time, current technology, and economic considerations, when guided by the concepts and principles disclosed herein will be readily capable of generating such software instructions and programs and hardware devices with minimal experimentation.

Embodiments of the invention are now described in detail. Referring to the drawings, like numbers indicate like parts throughout the views. As used in the description herein and throughout the claims, the following terms take the meanings explicitly associated herein, unless the context clearly dictates otherwise: the meaning of "a," "an," and "the" includes plural reference, the meaning of "in" includes "in" and "on." Relational terms such as first and second, top and bottom, and the like may be used solely to distinguish one entity or action from another entity or action without necessarily requiring or implying any actual such relationship or order between such entities or actions.

Turning first to FIG. 1, illustrated therein is a system 10 for reducing energy consumption of an appliance 14, such as, but not limited to, an air conditioning compressor, furnace, or heat pump. The system includes a control unit 12 having a current sense transformer 30 coupled thereto. The current sense transformer 30 is suitable for coupling serially with a control wire 32 disposed between a control switch 34 and the appliance 14.

One suitable device for the control unit 12 is a Digital Control Unit (DCU) box manufactured by Comverge, Inc. The DCU box is designed to be coupled outside near the air conditioning compressor. The DCU box may additionally be employed for communication through various channels, including through wide area and local area networks to an energy provider. Another suitable device would be a thermostat manufactured by Comverge, Inc. Rather than being disposed on the outside of a building, the thermostat would be placed within the building.

The control unit 12 facilitates delivery of a certain number of watts of reduction assuming that the level of demand is available. The relevant conditions for providing that reduction are that the appliance 14 is operating at an energy rate significantly larger that the desired reduction in the predetermined time period, such as the previous hour, prior to curtailment, and that in the absence of curtailment the appliance would continue to operate at that level or a greater level of energy consumption.

A detection module 36 is disposed within the control unit 12 and is configured to detect from the current sense transformer 30 when the control wire 32 is active. For example, when a control switch, such as a thermostat 38 within a building, closes, the current sense transformer 30 detects that the thermostat 38 is activating the appliance 14. The detection module 36 thus knows that the appliance 14 is "calling for" energy.

The system 10 implements load management by a reduction in energy, or the total kilowatt-hours called for within a given time frame. For example, the system 10 may curtail run time by a certain amount of energy called within a one-hour period. A processor 50 is configured to determine a fractional run time by monitoring the detection module 36. By integrating over a particular time period, such as one hour, when the appliance 14 is "calling" for energy, the processor 50 obtains an accurate estimate of the fraction of time during the particular time period that the appliance 14 is running.

A memory 46, coupled with the control unit 12, includes a connected load value stored therein. One example of a connected load value is the quantity, value or rating in kilowatts of the appliance 14. Such a connected load value may be either downloaded, wirelessly or otherwise, to the memory 46. In one embodiment, the control unit 12 further comprises a local receiver 52 configured to receive the connected load value from a local source. The local receiver 52 may be any of an infrared receiver, a radio frequency receiver, an optic receiver, a fiber optic receiver, or a wired receiver. For instance, the installer of the control unit 12 may connect a handheld device (not shown) to the control unit 12 by way of the local receiver 52 upon installation to transmit the connected load value to the memory.

The control unit installer has several alternatives to obtain accurate estimates of the connected load value. One available methodology is to actually measure the value. A current meter 15 can be attached to one power lead 16 to the appliance 14. When the appliance 14 is operations, the connected load value in kilowatts can be measured. An alternative method for obtaining an estimate of the connected load value is to examine data on the nameplate 18 of the appliance 14. For example, the nameplate 18 of some appliances 14, such as air conditioning compressors, will include the rating in British Thermal Units per hour (BTU/hr), or in air conditioner tons. The nameplate 18 may also include the SEER (seasonal energy efficiency rating). In another method, the BTU and SEER rating for most appliances 14 like air conditioning compressors can be determined from commercially available databases by using the manufacturer's name and compressor model number.

Once the connected load value is known, it may be stored to memory 46 in a variety of ways. By way of example, one method includes the control unit 12 using a handheld device that communicates with a processor 50 disposed within the control unit 12 by infrared, radio frequency, or wired connection. The processor 50 then stores the value in the memory 46. In an alternate method, the connected load value is transmitted to the control unit 12 using radio frequency or power-line carrier communication medium from a remote source 20.

In one embodiment, a receiver 48 is coupled with the control unit and is configured to receive a power reduction factor from a remote source 20, such as a utility or other energy provider. The receiver 48 may be any of a radio frequency receiver, a power line carrier receiver, or other receiver. The power reduction factor may be received by radio frequency communication, as the receiver 48 in one embodiment comprises a wireless transceiver. Alternatively, power line carrier communications, or other means, may also be used. When a curtailment event is initiated, the message transmitted to the control unit 12 contains the desired energy reduction, rather than a percentage curtailment time or a percentage of previous run time for curtailment and number of time based cycles of curtailment.

Additionally, the power reduction factor received may comprise a power reduction profile. The power reduction profile may include a series of power reduction factors, intended for implementation at various time intervals. One example of such a power reduction factor may be to reduce consumption by 1.0 kilowatt for the first hour, 1.5 kilowatts for the second hour, and 1.0 kilowatts for the third hour.

Upon receipt of the desired power reduction factor, the control unit 12, by way of the processor 50, takes the fractional run time measured for the previous hour (or other applicable given time frame, with such "other applicable time frame" concept being intended throughout this description without being repeated) and multiplies that value times the stored connected load. This product is an estimate in kilowatt-hour of the "meter" energy consumed by the appliance 14 during the previous hour. The desired kilowatt reduction time one hour is then subtracted from this value yielding the allowed energy consumption in each subsequent hour. The allowed energy consumption divided by the connected load value is the allowed run time per hour. As a percentage this value may be rounded up to the nearest selected percentage and submitted. Thus, the processor 50 is configured to calculate an allowed run time from the fractional run time and the power reduction factor.

By way of example, the processor 50 may calculate the allowed run time from the fractional run time to curtail energy consumption as follows:

A/C Size=3.0 tons (from nameplate)

SEER=10.0 (from nameplate)

kilowatt size=3.0 ton*12,000 BTU/ton-hr/10.0*1000=3.6 kilowatt (load this value into the control unit 12)

Transmit to control unit 12

1.0 kilowatt reduction desired 8 half hour cycles

Control unit 12, by way of processor 50, computes run time in previous hour with current sense transformer 30 measurement, and determines run time of 42 minutes.

Energy consumption in previous hour=3.6 Kilowatt-hour*42 minutes/60 minutes=2.52 Kilowatt-hour Allowed energy consumption in subsequent hours=2.5 Kilowatt-hour−1.0 Kilowatt-hour=1.5 Kilowatt-hour Allowed run time in subsequent hours=1.5/3.6=41.6%

Implement the usual 40% for 8 cycles.

This is implemented by way of a switch 34, operable by the processor 50 and coupled to the appliance 14. The processor 50 is configured to actuate the switch 34 so as to permit the appliance 14 to be operational in accordance with the allowed run time, which is calculated from the fractional run time and the power reduction factor. The control unit 12 thereby permits the appliance 14 to be operational in accordance with an allowed run time that corresponds to the maximum amount of energy allowed to be drawn by the appliance 14 in a given time period.

It is possible that the energy consumption in the previous hour will be less than the energy reduction desired. Direct implementation of this algorithm in that case would result in zero run time in subsequent hours. In the implementation of the existing algorithm, in such a case, the control unit 12 is allowed to operate for a predetermined duty cycle. For example, the predetermined duty cycle may be set to a 50% duty cycle. In this algorithm as well, if the run time in the previous hour is less than 10 minutes it is proposed that the duty cycle default to 50%.

Figure 2:
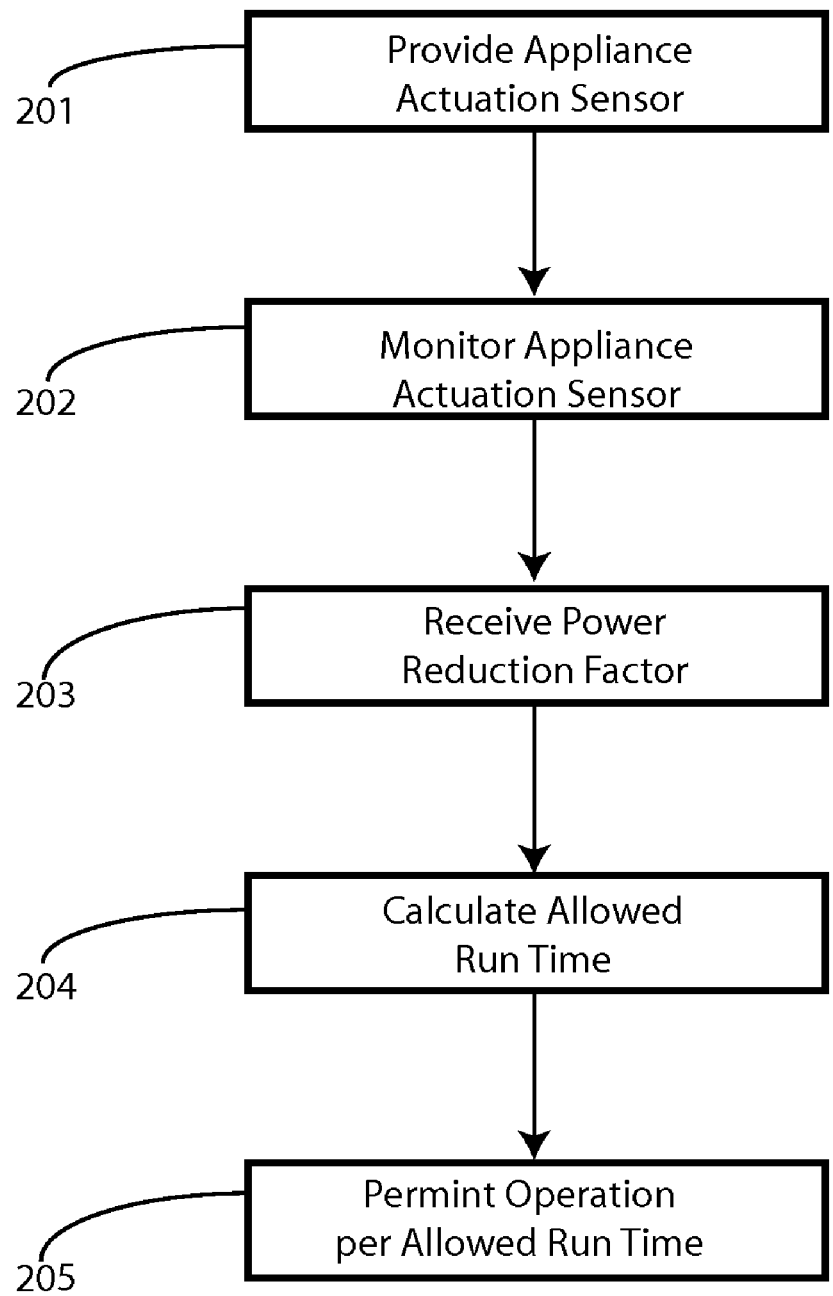
FIG. 2 illustrates a method in accordance with one embodiment of the invention.

Turning now to FIG. 2, illustrated therein is one embodiment of a method for reducing power consumption in an appliance in accordance with the invention. The method sets forth steps that may occur in executable software in conjunction with the system and control unit set forth above. At step 201, an appliance actuation sensor, one example of which is the current sense transformer, is provided. The appliance actuation sensor is configured to detect when the appliance is operational.

At step 202, the appliance actuation sensor is monitored for a predetermined monitoring period to detect a fractional run time. One example of such a predetermined monitoring time is one hour. Another example is every five minutes for one hour.

At step 203, a power reduction factor is received from a remote source, such as a wireless transmitter. One example of such a remote source is an energy provider such as a utility. The power reduction factor may be received by radio frequency or power line carrier.

At step 204, an allowed run time is calculated from the fractional run time and the power reduction factor. The allowed run time may be calculated by first multiplying the fractional run time with the connected load value, which is retrieved from a local memory. The allowed run time then includes the step of reducing the power consumption value by a power reduction factor. The step of reducing the power consumption value, in one embodiment, then includes subtracting the power reduction factor from the power consumption value. The difference between the power reduction factor and the power consumption value is then divided by the connected load value. In one embodiment, the allowed run time is then rounded by a predetermined percentage. Such a method is set forth in the example above.

At step 205, the appliance is permitted to be operational in accordance with the allowed run time. This step may include the steps of permitting the appliance to be operational for the allowed operating time and prohibiting the appliance from being operational for a difference between the predetermined monitoring time and the allowed operating time. Where the allowed run time is below a predetermined minimum allowed run time, the method may further include the step of setting the allowed run time to a default value.

In the foregoing specification, specific embodiments of the present invention have been described. However, one of ordinary skill in the art appreciates that various modifications and changes can be made without departing from the scope of the present invention as set forth in the claims below. Thus, while preferred embodiments of the invention have been illustrated and described, it is clear that the invention is not so limited. Numerous modifications, changes, variations, substitutions, and equivalents will occur to those skilled in the art without departing from the spirit and scope of the present invention as defined by the following claims. Accordingly, the specification and figures are to be regarded in an illustrative rather than a restrictive sense, and all such modifications are intended to be included within the scope of present invention.

What is claimed is:

1. A method for reducing energy consumption of an appliance, the method comprising the steps of:

providing an appliance actuation sensor configured to detect when the appliance is operational;

monitoring the appliance actuation sensor for a predetermined monitoring period to detect a fractional run time, wherein the fractional run time comprises a fraction of a predetermined period during which the appliance is calling for energy;

receiving a power reduction factor, the power reduction factor comprising a number of watts of consumption to be curtailed by the appliance during a predetermined period;

obtaining a connected load value corresponding to the appliance;

calculating an allowed energy consumption value from the fractional run time, the connected load value, and the power reduction factor;

calculating an allowed run time responsive to the allowed energy consumption that ensures a reduction of consumption by the appliance of at least the number of watts of consumption to be curtailed during the predetermined period; and permitting the appliance to be operational in accordance with the allowed run time.

2. The method of claim 1, further comprising the step of calculating the allowed run time comprises the step of multiplying the fractional run time with the connected load value.

3. The method of claim 2, wherein the step of calculating the allowed run time further comprises the step of reducing a power consumption value by the power reduction factor.

4. The method of claim 3, wherein the step of reducing the power consumption value comprises subtracting the power reduction factor from the power consumption value.

5. The method of claim 4, wherein the step of calculating the allowed run time further comprises dividing a difference between the power reduction factor and the power consumption value by the connected load value.

6. The method of claim 5, wherein the step of calculating the allowed run time further comprises rounding the allowed run time by a predetermined percentage.

7. The method of claim 1, further comprising the step of receiving the power reduction value from a remote source.

8. The method of claim 7, wherein the remote source comprises a wireless transmitter.

9. The method of claim 1, wherein the step of permitting the appliance to be operational in accordance with the allowed run time comprises:

permitting the appliance to be operational for the allowed run time; and prohibiting the appliance from being operational for a difference between the predetermined monitoring period and the allowed run time.

10. The method of claim 1, wherein when the allowed run time is below a predetermined minimum allowed run time, the method further comprises the step of setting the allowed run time to a default value.

11. The method of claim 1, wherein the power reduction factor comprises a power reduction profile.

12. the method of claim 11, wherein the power reduction profile comprises a series of power reduction values intended for implementation at predetermined time intervals, wherein each power reduction value comprises a number of watts of consumption by the appliance to be reduced during its corresponding predetermined time interval.

13. A system for reducing energy consumption of an appliance, the system comprising:

a control unit having a current sense transformer suitable for coupling serially with a control wire disposed between a control switch and an appliance;

a detection module configured to detect from the current sense transformer when the control wire is active;

a memory coupled with the control unit, the memory having a connected load value stored therein;

a receiver coupled with the control unit configured to receive a power reduction factor from a remote source, wherein the power reduction factor comprises a number of watts of consumption to be curtailed by the appliance during a predetermined period;

a processor configured to determine a fractional run time, wherein the fractional run time comprises a fraction of a predetermined period during which the appliance is calling for power, by monitoring the detection module, and to calculate an allowed run time from the fractional run time and the power reduction factor, the allowed run ensuring a reduction of consumption by the appliance of at least the number of watts of consumption to be curtailed during the predetermined period; and a switch, operable by the processor and coupled to the appliance, wherein the processor is configured to actuate the switch so as to permit the appliance to be operational in accordance with the allowed run time.

14. The system of claim 13, wherein the appliance is one of an air conditioning compressor, a heat pump, or a furnace.

15. The system of claim 13, wherein the receiver comprises a wireless receiver.

16. The system of claim 13, wherein the control unit further comprises a local receiver configured to receive the connected load value.

17. The system of claim 16, wherein the local receiver comprises a device selected from the group consisting of an infrared receiver, an optic receiver, a fiber optic receiver, a radio frequency receiver, and a wired receiver.

18. The system of claim 13, wherein the receiver comprises a device selected from the group consisting of a radio frequency receiver and a power line carrier receiver.

19. The system of claim 13, wherein the switch is coupled serially with the control wire.

\* \* \* \* \*